United States Patent
Suto et al.

(10) Patent No.: US 8,819,332 B2
(45) Date of Patent: Aug. 26, 2014

(54) NONVOLATILE STORAGE DEVICE PERFORMING PERIODIC ERROR CORRECTION DURING SUCCESSIVE PAGE COPY OPERATIONS

(75) Inventors: Masato Suto, Osaka (JP); Toshiyuki Honda, Kyoto (JP)

(73) Assignee: Panasonic Corporation, Osaka (JP)

(*) Notice: Subject to any disclaimer, the term of this patent is extended or adjusted under 35 U.S.C. 154(b) by 149 days.

(21) Appl. No.: 13/390,418

(22) PCT Filed: Feb. 2, 2011

(86) PCT No.: PCT/JP2011/000563
§ 371 (c)(1),
(2), (4) Date: Feb. 14, 2012

(87) PCT Pub. No.: WO2011/118114
PCT Pub. Date: Sep. 29, 2011

(65) Prior Publication Data
US 2012/0151166 A1    Jun. 14, 2012

(30) Foreign Application Priority Data

Mar. 26, 2010 (JP) .................. 2010-072008

(51) Int. Cl.
| | |
|---|---|
| G06F 12/00 | (2006.01) |
| G06F 3/06 | (2006.01) |
| G06F 11/10 | (2006.01) |
| G06F 12/02 | (2006.01) |
| G11C 29/04 | (2006.01) |

(52) U.S. Cl.
CPC ........ G06F 11/1068 (2013.01); G06F 12/0246 (2013.01); G11C 2029/0411 (2013.01); G06F 2212/1032 (2013.01); G06F 3/0679 (2013.01); G06F 3/064 (2013.01); G06F 3/0619 (2013.01)

USPC .......................................... 711/103

(58) Field of Classification Search
CPC ... G06F 11/1068; G06F 3/064; G06F 3/0619; G06F 3/0634; G06F 3/0679
See application file for complete search history.

(56) References Cited

U.S. PATENT DOCUMENTS

| | | |
|---|---|---|
| 6,769,087 B2 | 7/2004 | Moro et al. |
| 7,260,670 B2 | 8/2007 | Kawai |
| 7,372,744 B2 | 5/2008 | Shiga et al. |

(Continued)

FOREIGN PATENT DOCUMENTS

| | | |
|---|---|---|
| JP | 2001-297038 | 10/2001 |
| JP | 2005-78378 | 3/2005 |

(Continued)

OTHER PUBLICATIONS

International Search Report issued Apr. 19, 2011 in International (PCT) Application No. PCT/JP2011/000563.

*Primary Examiner* — April Y Blair
*Assistant Examiner* — Michael C Kolb
(74) *Attorney, Agent, or Firm* — Wenderoth, Lind & Ponack, L.L.P.

(57) ABSTRACT

Upon copying data stored on a page in a copy source block of a nonvolatile memory to a page of a copy destination block, an access control unit of a memory controller copies data stored on a page associated with a first copy method to a page of the copy destination block after error correction by an error correction control unit copies data stored on a page associated with a second copy method to a page of the copy destination block without performing the error correction by the error correction control unit according to a copy mode stored in a copy mode storage area, and changes the copy mode associated with the copy destination block to a copy mode that is different from the copy mode of the copy source block.

9 Claims, 14 Drawing Sheets

(56) References Cited

U.S. PATENT DOCUMENTS

| | | |
|---|---|---|
| 7,502,921 B2 | 3/2009 | Tomlin et al. |
| 7,877,593 B2 | 1/2011 | Tomlin et al. |
| 7,958,430 B1 * | 6/2011 | Kolokowsky et al. ........ 714/763 |
| 2001/0028523 A1 | 10/2001 | Moro et al. |
| 2005/0172086 A1 | 8/2005 | Kawai |
| 2006/0050314 A1 | 3/2006 | Shiga et al. |
| 2007/0033581 A1 | 2/2007 | Tomlin et al. |
| 2009/0172386 A1 | 7/2009 | Tomlin et al. |

FOREIGN PATENT DOCUMENTS

| | | | |
|---|---|---|---|
| JP | 2005078378 A * | 3/2005 | .............. G06F 12/16 |
| JP | 2005-216434 | 8/2005 | |
| JP | 2006-73141 | 3/2006 | |
| JP | 2008-9614 | 1/2008 | |
| JP | 2009-503726 | 1/2009 | |

* cited by examiner

FIG. 4

| LOGICAL BLOCK | PHYSICAL BLOCK |
|---|---|
| LB0 | PB202 |
| LB1 | PB358 |
| LB2 | UNASSIGNED |
| ⋮ | ⋮ |
| LB999 | PB1012 |

| | COPY MODE 0 | COPY MODE 1 | COPY MODE 2 | COPY MODE 3 |
|---|---|---|---|---|
| PP0 | NORMAL COPY | CHIP COPY | CHIP COPY | CHIP COPY |
| PP1 | CHIP COPY | NORMAL COPY | CHIP COPY | CHIP COPY |
| PP2 | CHIP COPY | CHIP COPY | NORMAL COPY | CHIP COPY |
| PP3 | CHIP COPY | CHIP COPY | CHIP COPY | NORMAL COPY |
| PP4 | NORMAL COPY | NORMAL COPY | CHIP COPY | CHIP COPY |
| PP5 | CHIP COPY | CHIP COPY | NORMAL COPY | CHIP COPY |
| PP6 | CHIP COPY | CHIP COPY | CHIP COPY | NORMAL COPY |
| PP7 | ... | ... | ... | ... |
| ... | | | | |

NONVOLATILE STORAGE DEVICE PERFORMING PERIODIC ERROR CORRECTION DURING SUCCESSIVE PAGE COPY OPERATIONS

TECHNICAL FIELD

The present invention relates to a memory controller which controls a nonvolatile memory such as a flash memory, and a nonvolatile storage device comprising the foregoing memory controller, and in particular relates to a method of writing data of a nonvolatile storage device using a nonvolatile semiconductor memory.

BACKGROUND ART

A semiconductor memory card, which is one type of medium for recording digital data such as music contents and video contents, uses a nonvolatile semiconductor memory such as a flash memory as its storage element.

When writing data in a NAND-type flash memory, which is one type of electrically erasable nonvolatile semiconductor memory, it is not possible to overwrite new data in a previously recorded area, and such data must be written in an area of a status in which data has been erased.

Thus, when rewriting data to a partial area midway in the block, block rewriting processing of writing new data in a deleted block, and copying all data in the block excluding the page to be subjected to rewriting to the deleted block is performed.

Disclosed is technology for performing the rewrite processing at a fast speed and ensuring the reliability of data when the foregoing rewriting of data to a part of the block of the nonvolatile memory occurs (for example, Patent Document 1).

Specifically, the copy processing from an old block of non-rewritten data to a new block is performed based on a chip copy that does not perform error correction, and the number of times (count) that the chip copy was performed to that block is recorded. When the count reaches a given count, the copy processing from the old block of the non-rewritten data to the new block is performed based on a normal copy that performs error correction.

Nevertheless, the time required for the foregoing copy processing differs depending on the normal copy and the chip copy, and variation in the processing time of data writing will occur. Thus, in an access device which performs the writing and reading of data to and from a nonvolatile memory, when implementing the real-time writing of contents data such as music or video, it is necessary to increase the buffer capacity to be mounted on the access device in order to enable the real-time writing even in cases where there is variation in the writing time or when the writing time is long, but this leads to increased costs.

Patent Document 1: Japanese Patent Application Laid-open No. 2005-78378

SUMMARY OF THE INVENTION

An object of this invention is to provide a nonvolatile storage device and a memory controller capable of reducing the buffer capacity to be mounted on an access device and thereby reducing costs by equalizing the processing time of data writing from the access device while maintaining the reliability of data upon writing data in a nonvolatile storage device.

The nonvolatile storage device according to one aspect of the present invention comprises a nonvolatile memory configured from a plurality of blocks which serve as erasing units, including a plurality of pages which serve as writing units, and a memory controller which performs writing and reading of data to and from the nonvolatile memory, wherein the nonvolatile memory includes a copy mode storage area capable of storing copy modes for deciding a method of copying data to the respective blocks, in association with the respective blocks, wherein the memory controller includes an access control unit which controls a writing operation and a reading operation of data to and from the nonvolatile memory, and an error correction control unit which performs error correction of data stored in the nonvolatile memory, wherein the copy mode includes N types (N is a natural number of 2 or higher) of copy modes from a first copy mode to an Nth copy mode, wherein each of the first to Nth copy modes defines, for each page, either a first copy method which copies data after performing the error correction by the error correction control unit, or a second copy method which copies data without performing the error correction by the error correction control unit, wherein each of the pages is associated with the first copy method in one or more copy modes among the first to Nth copy modes, and associated with the second copy method in other copy modes, and wherein, upon copying data stored on a page in a copy source block to a page of a copy destination block, the access control unit copies data stored on the page associated with the first copy method to a page of the copy destination block after the error correction by the error correction control unit, copies data stored on the page associated with the second copy method to a page of the copy destination block without performing the error correction by the error correction control unit according to a copy mode stored in the copy mode storage area, and changes the copy mode associated with the copy destination block to a copy mode that is different from the copy mode of the copy source block.

According to the foregoing configuration, it is possible to reduce the buffer capacity to be mounted on an access device and thereby reduce costs by equalizing the processing time of data writing from the access device while maintaining the reliability of data upon writing data in a nonvolatile storage device.

BRIEF DESCRIPTION OF THE DRAWINGS

FIG. 4 is a diagram showing an example of the configuration of the logical/physical conversion table illustrated in FIG. 1.

FIG. 14 is a schematic diagram explaining an example of another copy mode of the physical block in this embodiment.

DETAILED DESCRIPTION OF THE INVENTION

The nonvolatile memory system according to an embodiment of the present invention is now explained with reference to the appended drawings.

Figure 1:
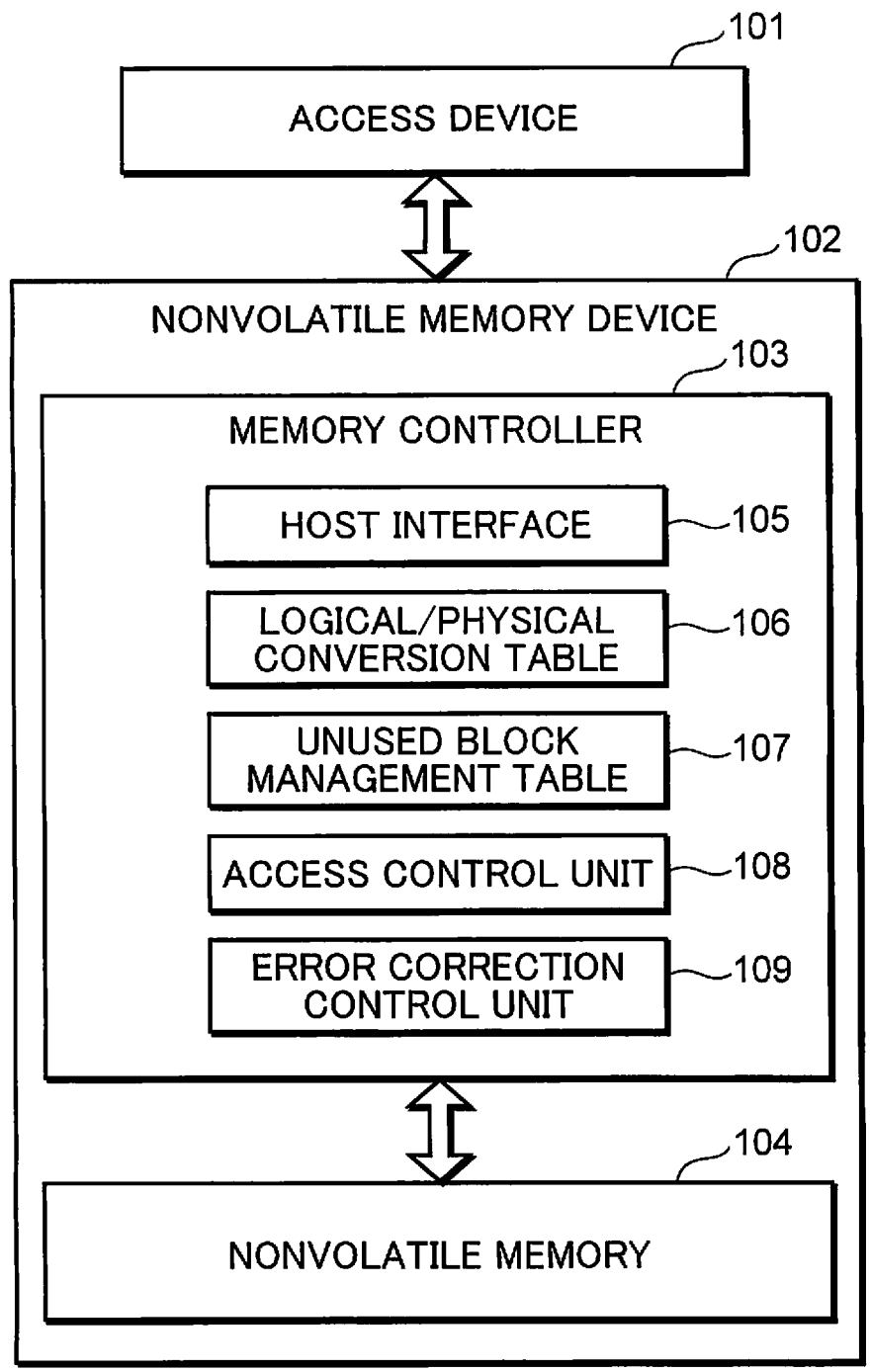
FIG. 1 is a block diagram showing the configuration of the nonvolatile memory system according to an embodiment of the present invention.

FIG. 1 is a block diagram showing the configuration of the nonvolatile memory system according to an embodiment of the present invention. The nonvolatile memory system shown in FIG. 1 is an example of the nonvolatile storage system, and includes an access device 101, and a nonvolatile memory device 102. The nonvolatile memory device 102 is communicable with the access device 101, and performs the writing and reading of data according to instructions from the access device 101. The nonvolatile memory device 102 is, for example, a semiconductor memory card, and is an example of a nonvolatile storage device. The access device 101 is a host device that performs the writing and reading of data to and from the nonvolatile memory device 102 and corresponds to, for example, a digital camera, a mobile phone, a video recorder, a computer or the like.

The nonvolatile memory device 102 includes a memory controller 103, and a nonvolatile memory 104. The memory controller 103 is a semiconductor circuit that receives commands from the access device 101 and controls the writing and reading of data to and from the nonvolatile memory 104. The nonvolatile memory 104 is a flash memory capable of retaining data without requiring any power source.

The memory controller 103 includes a host interface 105, a logical/physical conversion table 106, an unused block management table 107, an access control unit 108, and an error correction control unit 109.

The host interface 105 exchanges commands and data with the access device 101. The logical/physical conversion table 106 is a table for converting the logical address designated by the access device 101 to a physical address in the nonvolatile memory 104, and stores the correspondence information of the logical address and physical address of the data stored in the physical blocks of the nonvolatile memory 104. The unused block management table 107 is a table for managing the usage of the physical blocks in the nonvolatile memory 104.

The access control unit 108 is a semiconductor circuit which controls the writing and reading of data to and from the nonvolatile memory 104. The error correction control unit 109 is a semiconductor circuit which implements the error correction of data of the nonvolatile memory 104. Note that the configuration of the access control unit 108 and the error correction control unit 109 is not limited to the foregoing dedicated circuit, and the functions of the access control unit 108 and the error correction control unit 109 can also be realized by the CPU (Central Processing Unit) in the memory controller 103 executing predetermined software stored in a predetermined memory.

The nonvolatile memory 104 is a multilevel NAND-type flash memory including a plurality of physical blocks which serve as the erasing units of data, and stores host data such as contents data and file system data.

Figure 2:
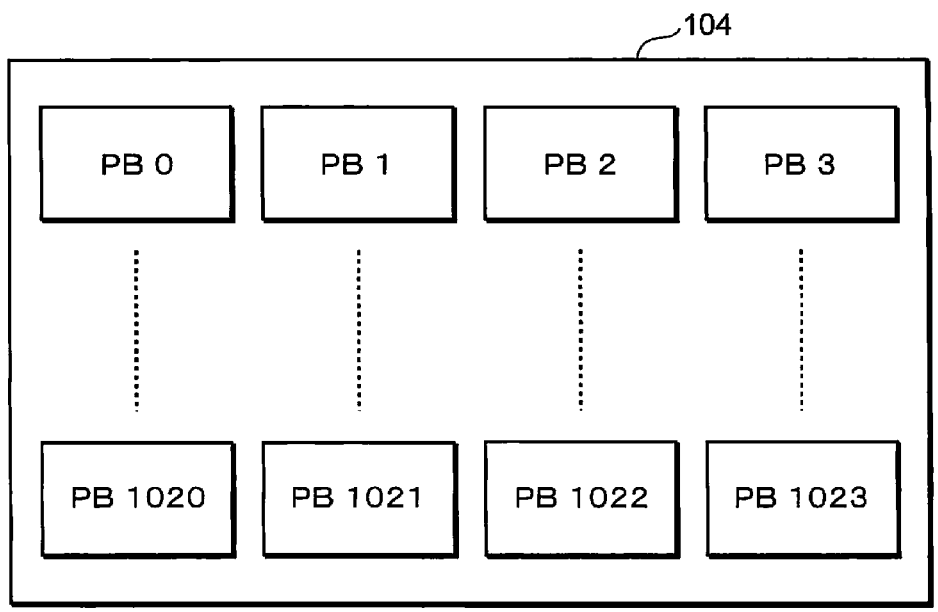
FIG. 2 is a schematic diagram explaining an example of the internal structure of the nonvolatile memory illustrated in FIG. 1.

FIG. 2 is a schematic diagram explaining an example of the internal structure of the nonvolatile memory 104. The nonvolatile memory 104 is configured, for example, from 1024 physical blocks of PB0 to PB1023. The physical blocks are erasing units of the nonvolatile memory 104 and, for example, the capacity per physical block is 512 KB (kilobytes).

Figure 3:
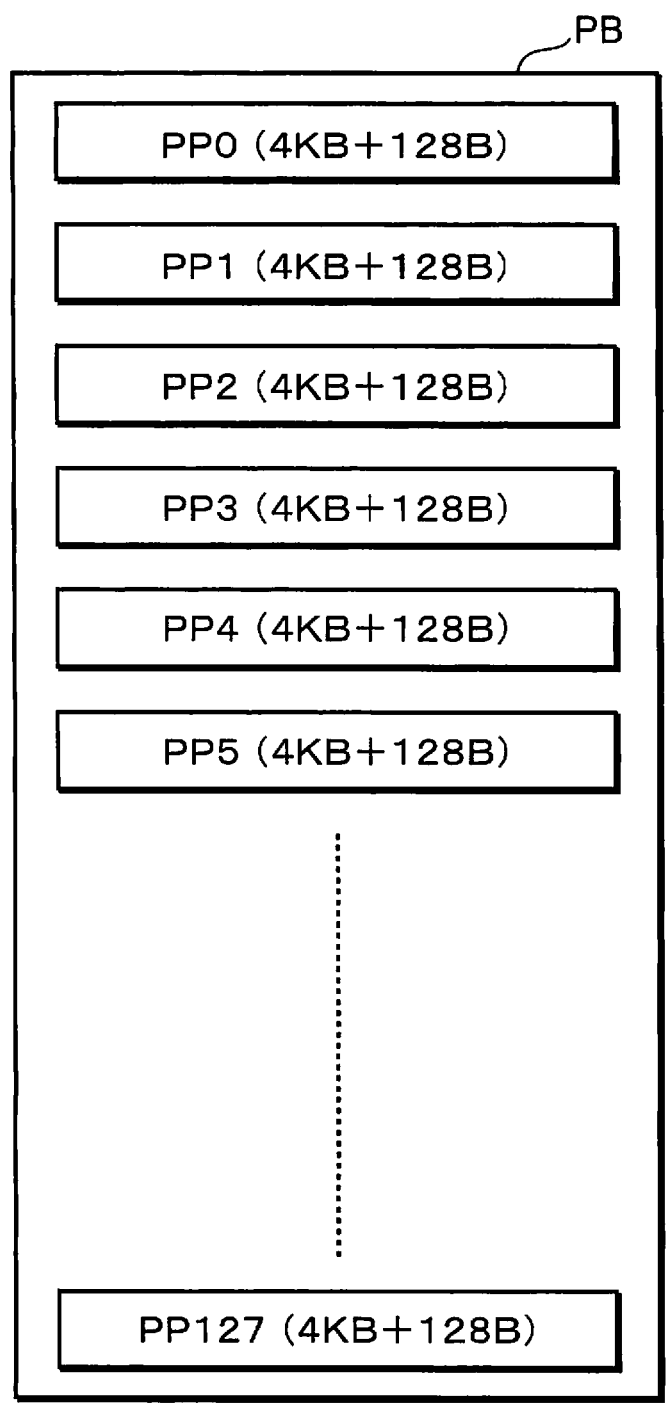
FIG. 3 is a schematic diagram explaining an example of the internal structure of the physical block of the nonvolatile memory illustrated in FIG. 1.

FIG. 3 is a schematic diagram explaining the internal structure of one physical block. The physical block PB is configured, for example, from 128 physical pages of PP0 to PP127. A physical page is the minimum unit of writing in the nonvolatile memory 104. When writing data, data is written in order from the physical page with the smallest number. The capacity per physical page is, for example, a total value upon adding 4 KB for storing data and 128 B for storing management information.

FIG. 4 is a diagram showing an example of the configuration of the logical/physical conversion table 106. The term "logical/physical conversion" refers to the processing of converting the logical address of a logical block (LB) obtained from the logical address designated by the access device 101 into a physical address of a physical block (PB) of the nonvolatile memory 104.

The logical/physical conversion table 106 is a table that stores associates and stores the physical address of the physical block to which the host data is written and the logical address of the logical block for performing the foregoing logical/physical conversion. If there is no physical block to which the host data is written relative to the logical block, a value which shows "unassigned" is set as the physical address corresponding to the logical address of that logical block.

Figure 5:
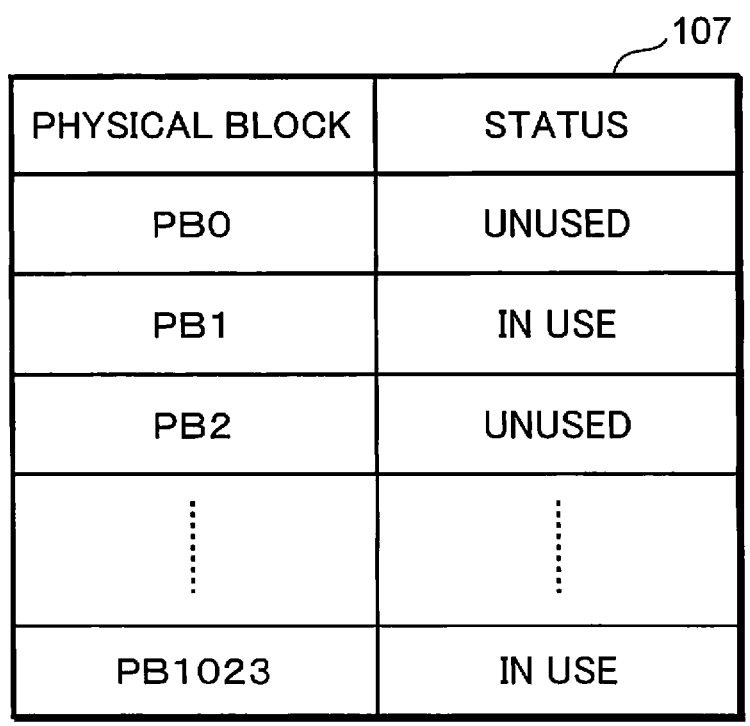
FIG. 5 is a diagram showing an example of the configuration of the unused block management table illustrated in FIG. 1.

FIG. 5 is a diagram showing an example of the configuration of the unused block management table 107. The unused block management table 107 is a table that shows whether each of the physical blocks is an in-use block that is being used as the block to which the host data is written, or an unused block that is not being used.

In the diagram, the column of "physical block" stores the physical address (PB0 to PB1023) of the physical block, and the column of "status" stores "in use" or "unused". The term "in use" shows that the block is being used as the block to which the host data is written, and the term "unused" shows that it is an unused block that is not being used. The access control unit 108 refers to the unused block management table 107 upon writing data, acquires the physical address of an unused physical block, and writes data in that physical block.

Figure 6:
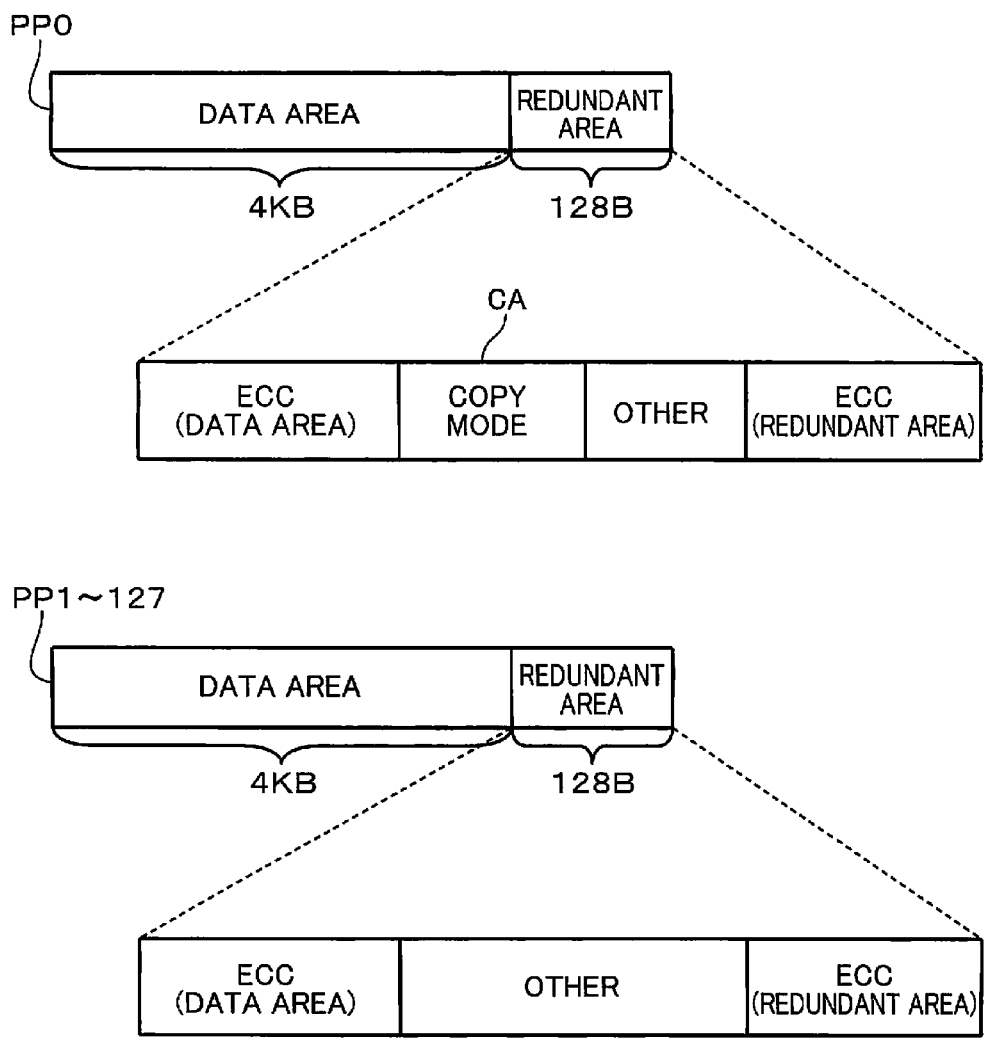
FIG. 6 is a schematic diagram explaining an example of the data structure of the physical page of the respective physical blocks of the nonvolatile memory illustrated in FIG. 1.

FIG. 6 is a schematic diagram explaining an example of the data structure of the physical page of the respective physical blocks. The physical page PP0 is configured from a data area of 4 KB for storing the host data, and a redundant area of 128 B for storing the management information. The redundant area stores an ECC (error correction code) of the data area, a copy mode for deciding the mode upon performing page copy, other information such as the page address, and an ECC (error correction code) of the redundant area, and the copy mode storage area CA in the redundant area stores the copy mode for deciding the method of copying data of the respective physical blocks. As the copy mode, for example, "0" or "1" is set. As described above, the nonvolatile memory 104 includes a copy mode storage area CA capable of storing copy modes for deciding the method of copying data to the respective physical blocks, in association with the respective blocks.

The physical pages PP1 to 127 are configured from a data area of 4 KB for storing the host data, and a redundant area of 128 B for storing the management information. The redundant area stores an ECC (error correction code) of the data area, other information such as the page address, and an ECC (error correction code) of the redundant area.

Note that the physical pages storing the copy mode are not limited to the foregoing example, and it is also possible to provide a copy mode storage area for storing the copy mode to other physical pages, provide a copy mode storage area for storing the copy mode to all physical pages, or otherwise change it variously.

[Write Processing of Host Data]

Figure 7:
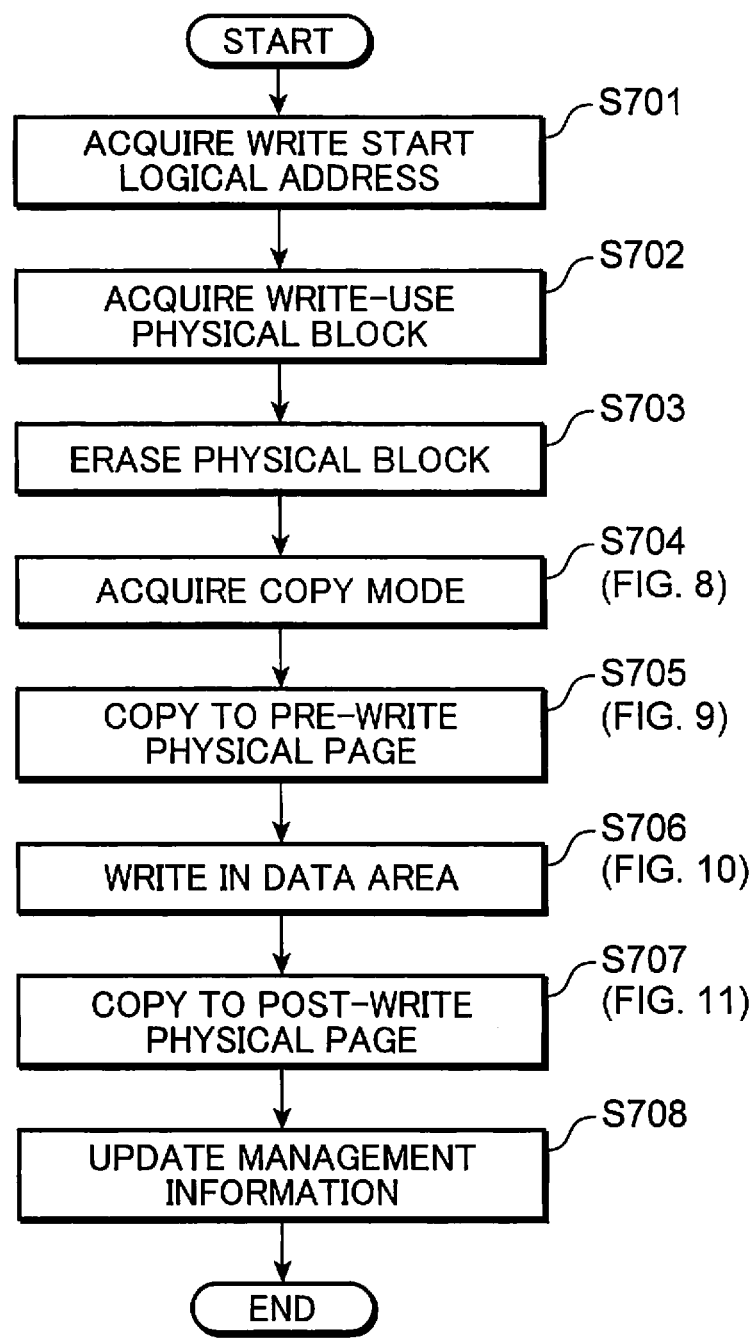
FIG. 7 is a flowchart explaining an example of the writing operation of the nonvolatile memory device illustrated in FIG. 1.

FIG. 7 is a flowchart explaining an example of the writing operation of the nonvolatile memory device 102 when the access device 101 sends, to the nonvolatile memory device 102, a write command, a write logical address, and write data. The processing of writing the host data from the access device 101 by copying data from a copy source block to a copy destination block in this embodiment is now explained with reference to the flowchart shown in FIG. 7, as well as FIG. 8 to FIG. 11.

Foremost, the host interface 105 of the memory controller 103 receives a write command from the access device 101, acquires the write logical address and write data designated by the access device 101, and notifies the write logical address and the like to the access control unit 108 (S701).

Subsequently, the access control unit 108 acquires the logical address of the logical block in which the writing of data is to be started upon converting the write logical address into a logical address in logical block units, refers to the logical/physical conversion table 106 and acquires the physical address of the physical block (hereinafter referred to as the "old block") corresponding to that logical block, refers to the unused block management table 107 and acquires the physical address of an unused physical block (hereinafter referred to as the "new block"), and thereby acquires a write-use physical block (S702).

Subsequently, the access control unit 108 erases the new block to serve as the copy destination block (S703). Subsequently, the access control unit 108 reads and acquires the copy mode from the copy mode storage area CA of the physical page PP0 of the old block to become the copy source block (S704).

Figure 8:
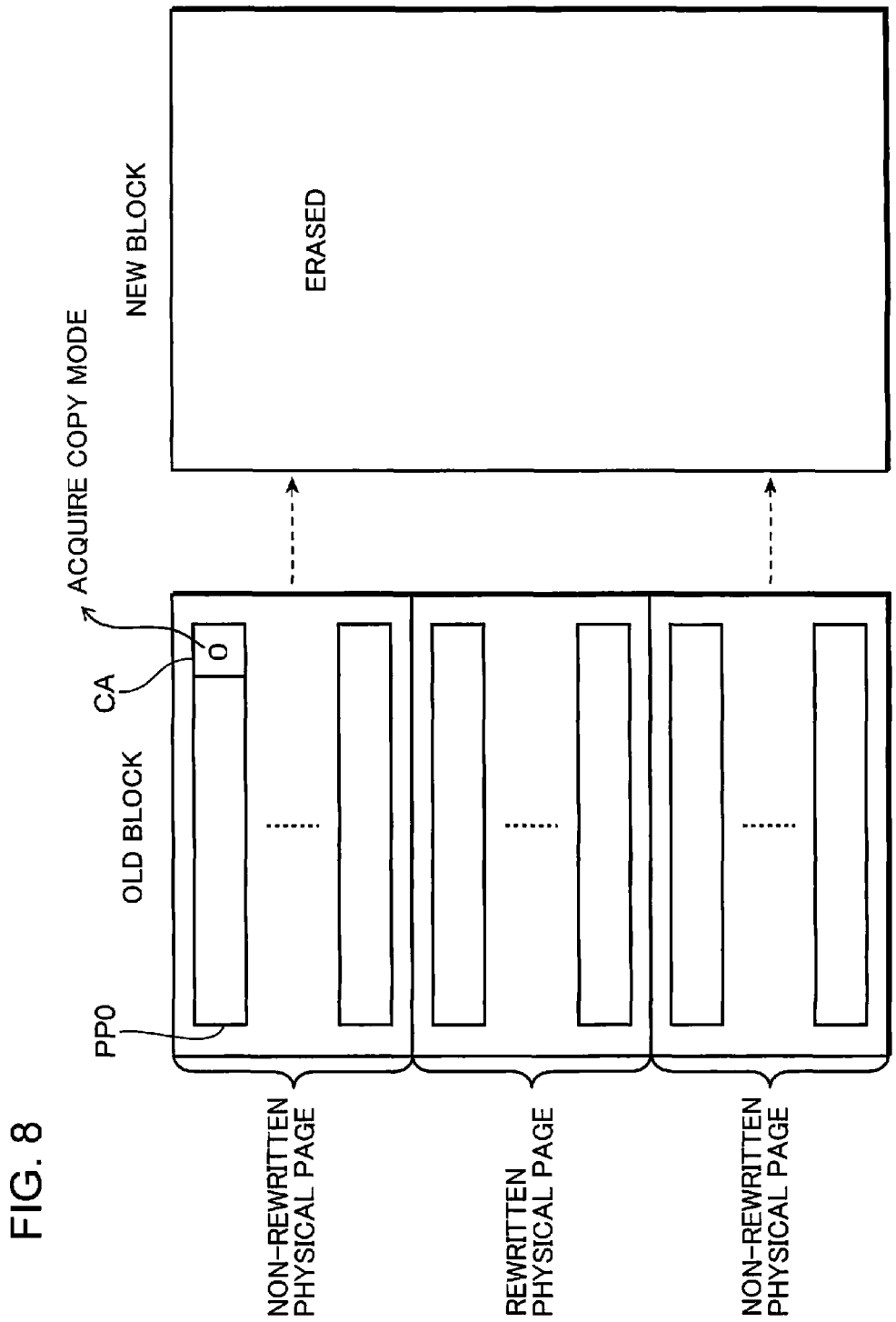
FIG. 8 is a schematic diagram explaining an example of the processing of reading the copy mode from the start physical page of the physical block of the nonvolatile memory illustrated in FIG. 1.

FIG. 8 is a schematic diagram explaining an example of the processing of reading the copy mode from the start physical page of the physical block. As shown in FIG. 8, the old block includes an upper row non-rewritten physical page, a middle row rewritten physical page, and a lower row non-rewritten physical page. Here, FIG. 8 to FIG. 11 show write processing where the data of the upper row non-rewritten physical page and the lower row non-rewritten physical page of the old block is copied to a physical block of a new block corresponding to the foregoing physical pages, and the host data from the access device 101 is written in the physical page of the new block corresponding to the middle row rewritten physical page of the old block. In this write processing, as shown in FIG. 8, the access control unit 108 reads and acquires the copy mode "0" from the copy mode storage area CA of the start physical page PP0 of the old block.

Subsequently, the access control unit 108 copies the non-rewritten data immediately before the write data from the old block to the new block by the copy method according to the read copy mode (S705).

Figure 9:
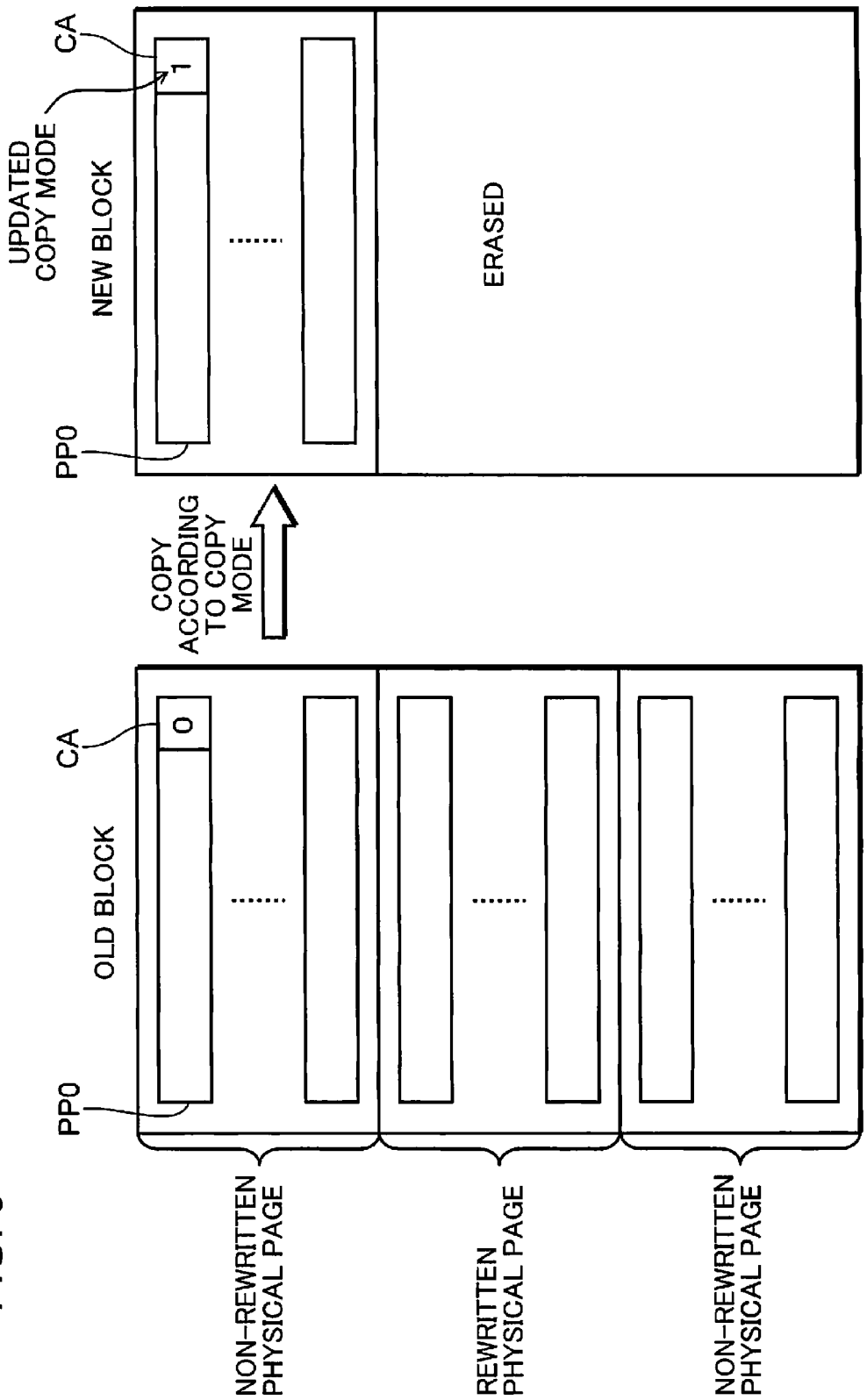
FIG. 9 is a schematic diagram explaining an example of the pre-write physical page copy processing of copying the first non-rewritten data of the physical block of the nonvolatile memory illustrated in FIG. 1.

FIG. 9 is a schematic diagram explaining an example of the pre-write physical page copy processing of copying the first non-rewritten data of the physical block. As shown in FIG. 9, the access control unit 108 copies the non-rewritten data immediately before the write data from the upper row non-rewritten physical page of the old block to the upper row physical page of the new block by the copy method according to the read copy mode, and additionally updates the copy mode of the copy mode storage area CA in the physical page PP0 of the new block to "1" when the read copy mode is "0", and updates the copy mode of the copy mode storage area CA in the physical page PP0 of the new block to "0" when the read copy mode is "1".

Figure 10:
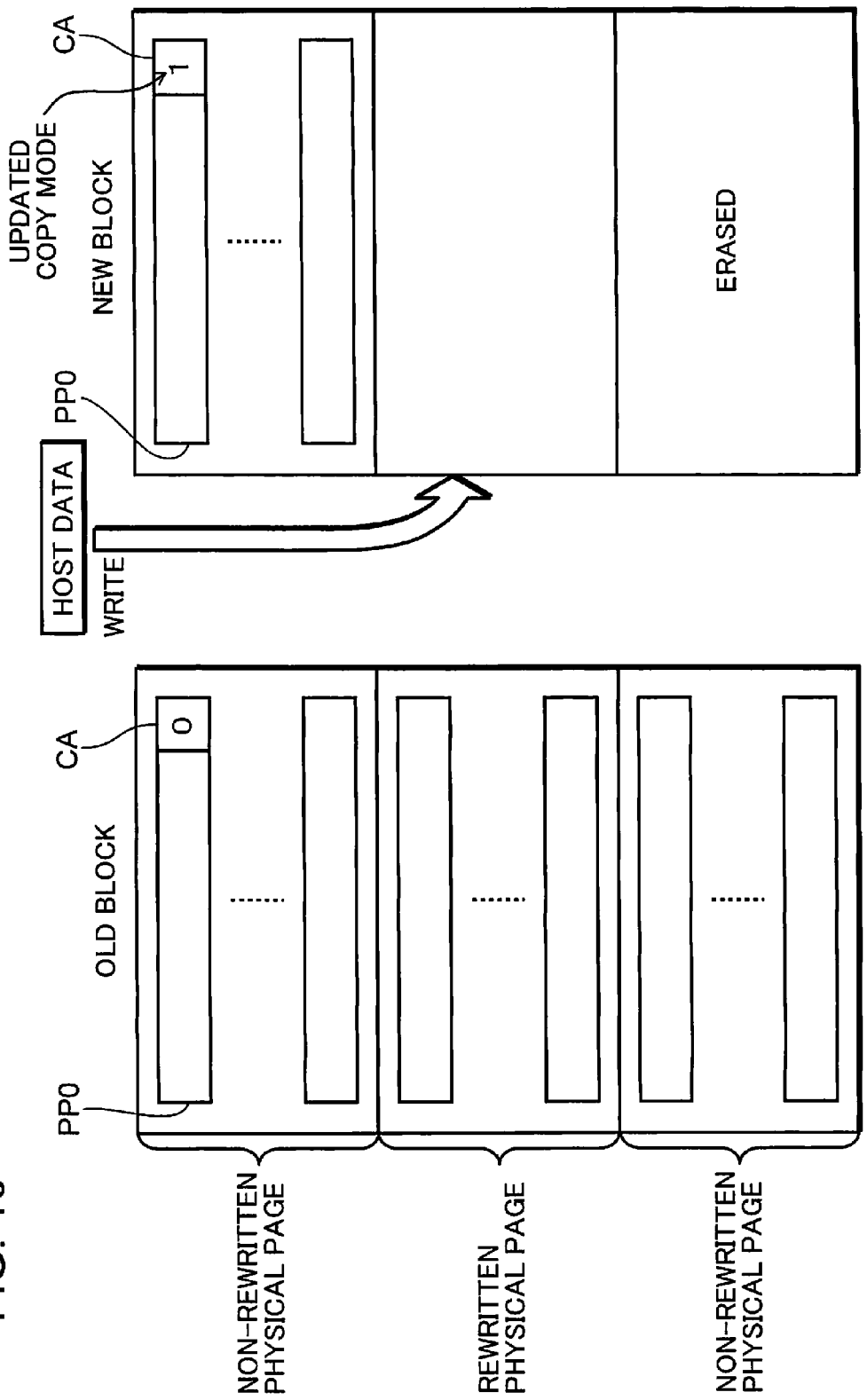
FIG. 10 is a schematic diagram explaining an example of the write processing of new data of the physical block of the nonvolatile memory illustrated in FIG. 1.

Next, the access control unit 108 writes the write data in the data area of the new block (S706). FIG. 10 is a schematic diagram explaining an example of the write processing of the new data of the physical block. As shown in FIG. 10, the access control unit 108 writes the host data (write data) from the access device 101 to the middle row physical page of the new block corresponding to the middle row rewritten physical page of the old block.

Figure 11:
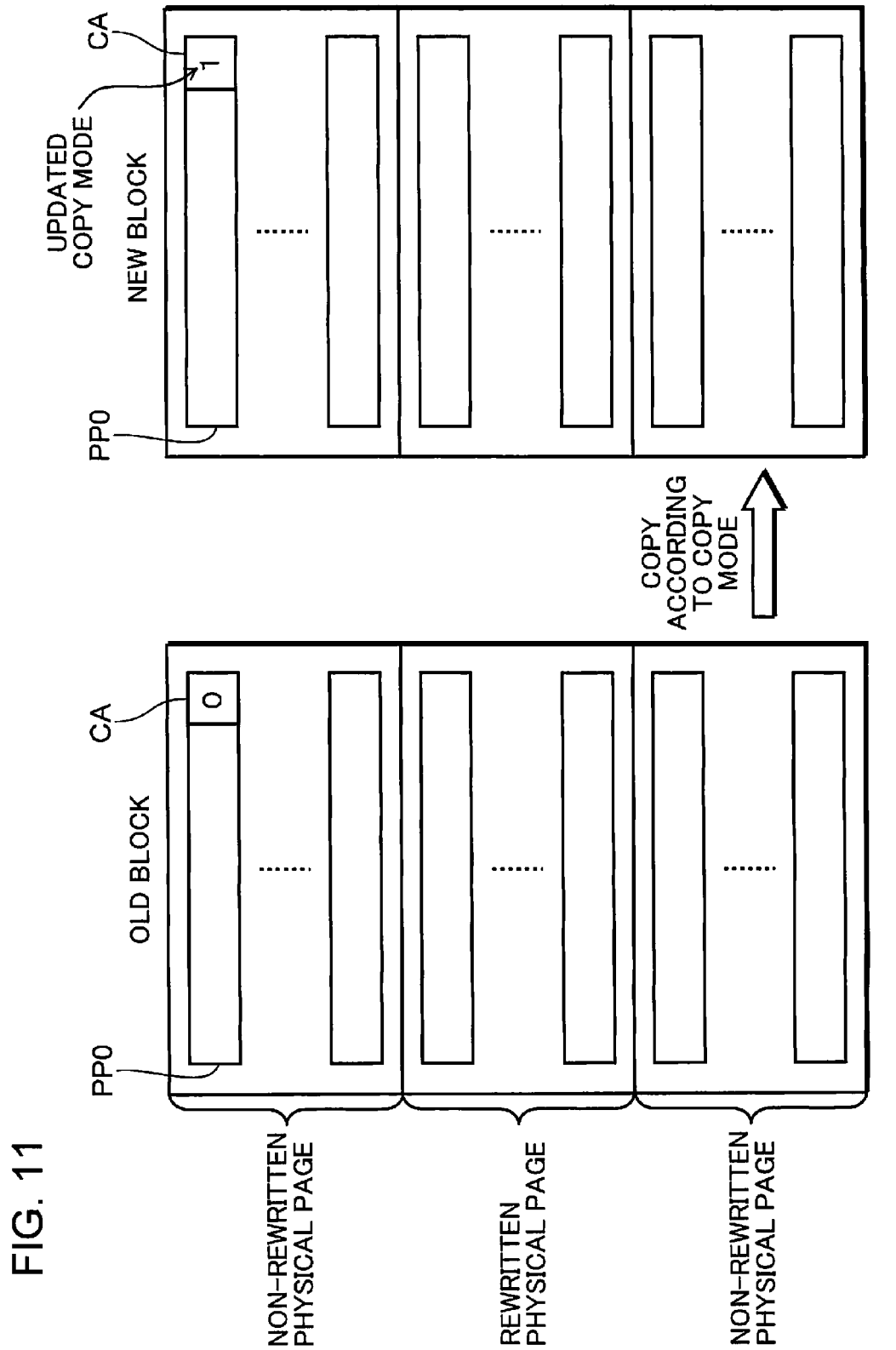
FIG. 11 is a schematic diagram explaining an example of the post-write physical page copy processing of copying the subsequent non-rewritten data of the physical block of the nonvolatile memory illustrated in FIG. 1.

Next, as shown in FIG. 11, the access control unit 108 copies the non-rewritten data from immediately after the write data to the end of the physical block from the old block to the new block by the copy method according to the read copy mode (S707).

FIG. 11 is a schematic diagram explaining an example of the post-write physical page copy processing of copying the subsequent non-rewritten data of the physical block. As shown in FIG. 11, the access control unit 108 copies the non-rewritten data from immediately after the write data to the end of the physical block from the lower row non-rewritten physical page of the old block to the lower row physical page of the new block by the copy method according to the read copy mode.

Finally, the access control unit 108 updates the logical/physical conversion table 106 by setting the physical address of the new block to the physical block corresponding to the write logical address, updates the unused block management table 107 by setting "unused" to the old block and "in use" to the new block and writes the updated logical/physical conversion table 106 and the updated unused block management table 107 in the management data storage area of the nonvolatile memory 104 (S708).

Based on the foregoing processing, in this embodiment, it is possible to write the write data sent from the access device 101 in the nonvolatile memory 104 while copying data from the old block to the new block by the copy method according to the copy mode.

The copy processing (S705, S707) from the old block to the new block that is implemented in the flowchart shown in FIG. 7 described above is now explained in further detail. In this embodiment, the normal copy of performing error correction to the data to be copied and the chip copy of not performing error correction to the data to be copied are used properly in the foregoing copy processing according to the copy mode that was read from the physical page PP0 of the old block.

[Normal Copy]

The normal copy routine is explained below. Foremost, the access control unit 108 reads one physical page worth of data from the old block of the nonvolatile memory 104, and outputs this to the error correction control unit 109. Subsequently, the error correction control unit 109 acquires an ECC (error correction code) of the data area from the redundant area of one physical page worth of data that was read, performs error correction of the data area, and outputs the data that was subjected to error correction to the access control unit 108. Finally, the access control unit 108 writes one physical page worth of data that was subjected to error correction to the new block of the nonvolatile memory 104. The foregoing processing is the normal copy. Since the normal copy is a copy method in which error correction is performed, the reliability of data is ensured.

[Chip Copy]

The chip copy routine is explained below. Foremost, the access control unit 108 sends a copy command of one physical page worth of data to the nonvolatile memory 104 as a command for instructing the copy processing based on the chip copy. Finally, the nonvolatile memory 104 copies the data that is internally stored on the physical page of the old block to the physical page of the new block. The foregoing processing is the chip copy. Since the chip copy is a copy method that does not perform error correction and a copy method in which the data transfer between the nonvolatile memory 104 and the memory controller 103 is not performed, it is faster than the normal copy.

[Proper Use of Copy Methods]

Figure 12:
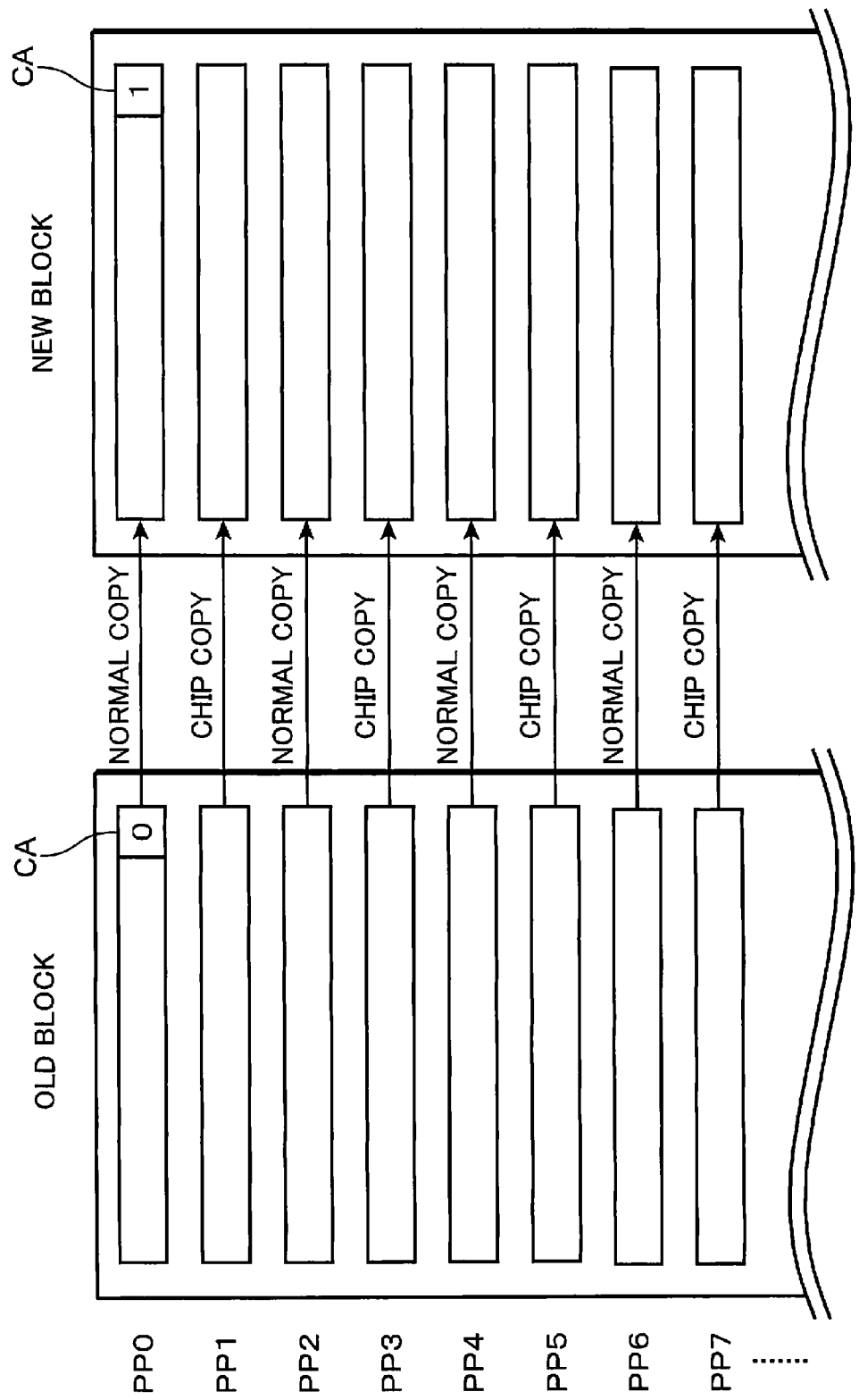
FIG. 12 is a schematic diagram explaining an example of the copy processing when the copy mode of the physical block in this embodiment is "0".

The method of properly using the normal copy and the chip copy according to the copy mode is now explained. FIG. 12 is a diagram showing an example of properly using the physical page to be subjected to the normal copy and the physical page to be subjected to the chip copy in the foregoing copy processing from the old block to the new block in a case where the copy mode that was read from the physical page PP0 of the old block is "0". In this diagram, the normal copy is applied to a physical page in which the physical page number is even, and the chip copy is applied to a physical page in which the physical page number is odd.

Figure 13:
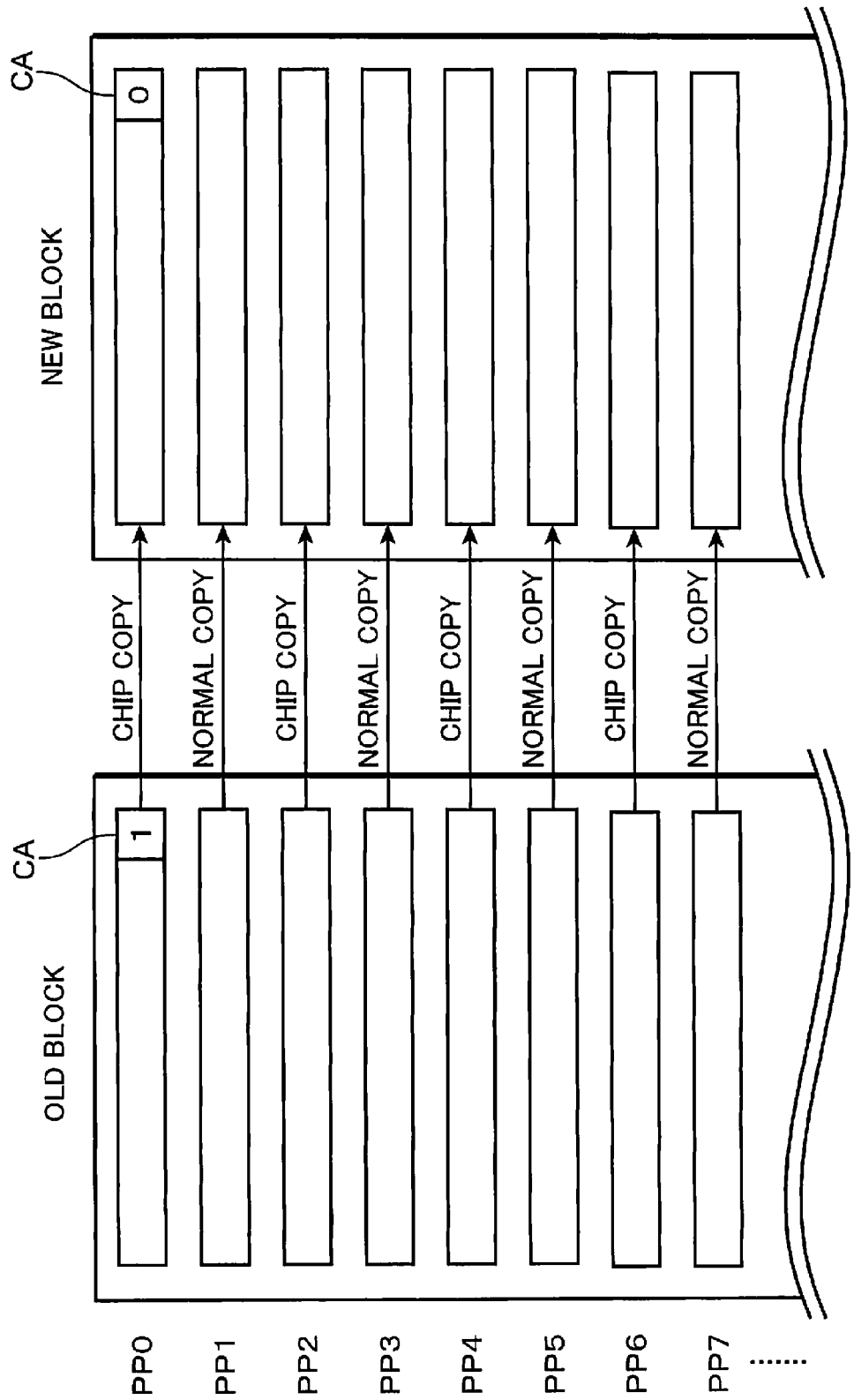
FIG. 13 is a schematic diagram explaining an example of the copy processing when the copy mode of the physical block in this embodiment is "1".

FIG. 13 is a diagram showing an example of properly using the physical page to be subjected to the normal copy and the physical page to be subjected to the chip copy in the foregoing copy processing from the old block to the new block in a case where the copy mode that was read from the physical page PP0 of the old block is "1". In this diagram, the normal copy is applied to a physical page in which the physical page number is odd, and the chip copy is applied to a physical page in which the physical page number is even.

The method of properly using the normal copy and the chip copy according to the copy mode was explained above. Accordingly, in this embodiment, since the normal copy count and the chip copy count will be equal regardless of the value of the copy mode, the effect of preventing the occurrence of variation in the writing time is yielded. Moreover, since all data is subjected to error correction once by implementing the copy from the old block to the new block twice, the reliability of data is also maintained.

Moreover, the method of properly using the normal copy and the chip copy based on even pages and odd pages used in this embodiment is able to reduce the variation in the writing time when writing new data in an erased physical block and copying all data in the physical block excluding the write target page to the erased block upon performing the rewriting of data since the normal copy count and the chip copy count will be equal regardless of which physical page in the physical block is a rewritten physical page.

Note that, although this embodiment was explained as described above, the present invention is not limited to this embodiment, and can be variously modified so as long as it does not deviate from the gist hereof. For example, the following cases are also covered by the present invention.

(1) In this embodiment, although the copy mode was a method of storing in a redundant area of the physical page PP0 of the respective blocks of the nonvolatile memory 104, so as long as it is possible to associate the copy mode to the respective blocks even when stored in another area of the nonvolatile memory 104, the same configuration as this embodiment can be realized, and the same effects can be yielded.

(2) In this embodiment, although the normal copy was a method of reading one physical page worth of data from an old block of the nonvolatile memory 104 and, after implementing error correction, writing one physical page worth of data to a new block of the nonvolatile memory 104, the same configuration as this embodiment can be realized and the same effects can be yielded even when the processing target is a plurality of physical pages, and not one physical page.

(3) In this embodiment, although the chip copy sends a copy command to the nonvolatile memory 104, the copy command does not necessarily have to be used, and the same configuration as this embodiment can be realized and the same effects can be yielded so as long as it is a method of copying data without implementing error correction.

(4) In this embodiment, although two types of copy modes; namely, "0" or "1" were used, it is also possible to use more copy modes; for example, N types (N is a natural number of 2 or higher) of copy modes from the first copy mode to the Nth copy mode. In the foregoing case, each of the first to Nth copy modes defines, for each physical page, either a first copy method which copies data after performing the error correction by the error correction control unit 109, or a second copy method which copies data without performing the error correction by the error correction control unit 109, and each of the physical pages is associated with the first copy method in one or more copy modes among the first to Nth copy modes, and associated with the second copy method in other copy modes.

As described above, even when using N types of copy modes from the first copy mode to the Nth copy mode, the same configuration as this embodiment can be realized and the same effects can be yielded so as long as the number of physical pages to be subjected to error correction in the respective copy mode is equal.

For example, the method of properly using the normal copy and chip copy when using the four types of copy modes of 0 to 3 is shown in FIG. 14. In the example shown in FIG. 14, four types of copy modes; namely, copy mode 0 to copy mode 4, are set in advance, and data among "0", "1", "2" and "3" is stored in the copy mode storage area as the copy mode.

Foremost, when the copy mode is "0", the normal copy is performed to the physical pages PP0, PP4, . . . , the chip copy is performed to the other physical pages PP1 to PP3, PP5 to PP7, . . . , and the copy mode of the copy mode storage area is changed to "1" after the foregoing copy processing.

Similar to the above, when the copy mode is "1", the normal copy is performed to the physical pages PP1, PP5, . . . , the chip copy is performed to the other physical pages, and the copy mode of the copy mode storage area is changed to "2" after the foregoing copy processing. When the copy mode is "2", the normal copy is performed to the physical pages PP2, PP6, . . . , the chip copy is performed to the other physical pages, and the copy mode of the copy mode storage area is changed to "3" after the foregoing copy processing. When the copy mode is "3", the normal copy is performed to the physical pages PP3, PP7, . . . , the chip copy is performed to the other physical pages, and the copy mode of the copy mode storage area is changed to "0" after the foregoing copy processing. Subsequently, the foregoing processing is repeated.

In the foregoing example, when copy mode 0 to copy mode 4 are executed, the normal copy is performed once and the chip copy is performed three times on the respective physical pages. Consequently, for physical pages, since the copy processing by the normal copy is performed once without fail, and the remaining copy processing is performed based on the copy processing by the high-speed chip copy as a result of performing copy mode 0 to copy mode 4, it is possible to shorten the processing time of the respective copy modes while maintaining the reliability of data.

Note that, in the foregoing example, the physical pages to be subjected to the normal copy in the respective copy modes are not limited to the foregoing example, and, so as long as the number of physical pages to be subjected to the normal copy in the respective copy modes is the same number, the physical page to be subjected to the normal copy may be changed. For example, in the example shown in FIG. 14, the copy method of copy mode 0 and the copy method of copy mode 1 can be switched for the physical page PP1, or other various changes can be made.

Moreover, instead of four types of copy modes, it is also possible to set eight types or sixteen types of copy modes, and perform the normal copy only once or perform the normal copy a plurality of times of twice or more among the eight or sixteen copy processes.

Moreover, it is also possible to associate each of the physical pages with the normal copy in the first to Nth copy modes so that the copy count of the normal copy becomes the same. In the foregoing case, even in cases where the number of physical pages to be subjected to the normal copy in the respective copy modes is not the same, so as long as the difference between the maximum normal copy count and the minimum normal copy count in the respective copy modes is a predetermined value or less; for instance, 20% or less, preferably 10% or less and more preferably 5% or less, of the maximum normal copy count, it is possible to basically equalize the processing time of data writing, and yield the same effects as those described above.

(5) In this embodiment, although the physical page to be subjected to error correction in a predetermined copy mode is not subjected to error correction in all other copy modes, error correction can also be performed in a plurality of copy modes among the first to Nth copy modes. In particular, if there is a physical page with a high percentage of error occurrence, the method of performing error correction of that physical page in a plurality of copy modes is effective since it can better prevent damage to the data and realize higher reliability.

For instance, in the example shown in FIG. 14, although the normal copy was only performed once among the four copy processes based on the four types of copy modes, the normal copy can also be performed twice or three times among the four copy processes, and the copy mode 2 of the physical page PP0 can be changed to the normal copy, or otherwise changed variously.

(6) In this embodiment, although the normal copy and the chip copy were properly used based on even pages and odd pages, the same configuration as this embodiment can be realized and the same effects can be yielded so as long as it is a method of performing the normal copy and the chip copy equally.

Based on the foregoing embodiments, the present invention can be summarized as follows. Specifically, the nonvolatile storage device according to the present invention comprises a nonvolatile memory configured from a plurality of blocks which serve as erasing units, including a plurality of pages which serve as writing units, and a memory controller which performs writing and reading of data to and from the nonvolatile memory, wherein the nonvolatile memory includes a copy mode storage area capable of storing copy modes for deciding a method of copying data to the respective blocks, in association with the respective blocks, wherein the memory controller includes an access control unit which controls a writing operation and a reading operation of data to and from the nonvolatile memory, and an error correction control unit which performs error correction of data stored in the nonvolatile memory, wherein the copy mode includes N types (N is a natural number of 2 or higher) of copy modes from a first copy mode to an Nth copy mode, wherein each of the first to Nth copy modes defines, for each page, either a first copy method which copies data after performing the error correction by the error correction control unit, or a second copy method which copies data without performing the error correction by the error correction control unit, wherein each of the pages is associated with the first copy method in one or more copy modes among the first to Nth copy modes, and associated with the second copy method in other copy modes, and wherein, upon copying data stored on a page in a copy source block to a page of a copy destination block, the access control unit copies data stored on the page associated with the first copy method to a page of the copy destination block after the error correction by the error correction control unit, copies data stored on the page associated with the second copy method to a page of the copy destination block without performing the error correction by the error correction control unit according to a copy mode stored in the copy mode storage area, and changes the copy mode associated with the copy destination block to a copy mode that is different from the copy mode of the copy source block.

The memory controller according to the present invention is a memory controller which performs writing and reading of data to and from a nonvolatile memory, wherein the nonvolatile memory includes a copy mode storage area capable of storing copy modes for deciding a method of copying data to the respective blocks, in association with the respective blocks, wherein the memory controller includes an access control unit which controls a writing operation and a reading operation of data to and from the nonvolatile memory, and an error correction control unit which performs error correction of data stored in the nonvolatile memory, wherein the copy mode includes N types (N is a natural number of 2 or higher) of copy modes from a first copy mode to an Nth copy mode, wherein each of the first to Nth copy modes defines, for each page, either a first copy method which copies data after performing the error correction by the error correction control unit, or a second copy method which copies data without performing the error correction by the error correction control unit, wherein each of the pages is associated with the first copy method in one or more copy modes among the first to Nth copy modes, and associated with the second copy method in other copy modes, and wherein, upon copying data stored on a page in a copy source block to a page of a copy destination block, the access control unit copies data stored on the page associated with the first copy method to a page of the copy destination block after the error correction by the error correction control unit, copies data stored on the page associated with the second copy method to a page of the copy destination block without performing the error correction by the error correction control unit according to a copy mode stored in the copy mode storage area, and changes the copy mode associated with the copy destination block to a copy mode that is different from the copy mode of the copy source block.

According to the foregoing configuration, upon copying data stored on a page in a copy source block to a page of a copy destination block, since the access control unit copies data stored on the page associated with the first copy method to a page of the copy destination block after the error correction by the error correction control unit, copies data stored on the page associated with the second copy method to a page of the copy destination block without performing the error correction by the error correction control unit according to a copy mode stored in the copy mode storage area, and changes the copy mode associated with the copy destination block to a copy mode that is different from the copy mode of the copy source block, it is possible to switch to a copy mode that is different from the copy mode that was used in the previous copy upon writing data in nonvolatile storage device, and perform the copy processing based on the first copy method or the copy processing based on the second copy method according to the copy mode.

Here, since each page is associated with the first copy mode which performs error correction in the one or more copy modes among the first to Nth copy modes, error correction is performed to the data of all pages one or more times while the first to Nth copy modes are being sequentially executed, and it is thereby possible to retain the reliability of data upon writing data in the nonvolatile storage device. Moreover, since each copy mode is a combination of the first copy method which performs error correction and the second copy method which does not perform error correction, it is possible to equalize the processing time of data writing in the respective copy modes.

Consequently, it is possible to reduce the buffer capacity to be mounted on an access device and thereby reduce costs by equalizing the processing time of data writing from the access device while maintaining the reliability of data upon writing data in a nonvolatile storage device.

Preferably, as the copy mode storage area, each of the blocks includes an area capable of storing a copy mode related to the block on one or more pages among a plurality of pages contained in the block.

In the foregoing case, since each of the blocks includes a copy mode storage area capable of storing a copy mode related to the block on one or more pages among a plurality of pages contained in the block, it is possible to read the copy mode of the block from the copy mode storage area for each block, copy data stored on the page associated with the first copy method to a page of the copy destination block after the error correction by the error correction control unit, and copy data stored on the page associated with the second copy method to a page of the copy destination block without performing the error correction by the error correction control unit according to the copy mode.

Preferably, upon performing copy processing according to the second copy method, the access control unit sends a command instructing the copy processing according to the second copy method to the nonvolatile memory, and thereby causes the copy processing according to the second copy method to be executed in the nonvolatile memory.

In the foregoing case, since the access control unit only sends a command instructing the copy processing according to the second copy method to the nonvolatile memory and thereby causes the copy processing according to the second copy method to be executed in the nonvolatile memory, in addition to the error correction not being performed, data transfer between the nonvolatile memory and the memory controller is also not performed. Thus, it is possible to execute the copy processing according to the second copy method at a fast speed, and shorten the processing time of the respective copy modes.

Preferably, each of the pages is associated with the first copy method only in one copy mode among the first to Nth copy modes.

In the foregoing case, on each page, since the copy processing by the first copy method is only executed once in the first to Nth copy modes, and the other copy processing is executed based on the copy processing by the high-speed second copy method, it is possible to reduce the processing time of the respective copy modes while maintaining the reliability of data.

Preferably, each of the pages is associated with the first copy method equally in the first to Nth copy modes.

In the foregoing case, since each page is associated with the first copy method equally in the first to Nth copy modes, it is possible to equalize the processing time of the respective copy modes.

Preferably, each of the pages is associated with the first copy method in the first to Nth copy modes so that a copy count by the first copy method becomes the same.

In the foregoing case, since each page is associated with the first copy method in the first to Nth copy modes so that a copy count by the first copy method becomes the same, it is possible to cause the processing time of the respective copy mode to be the same.

Preferably, as the copy mode storage area, each of the blocks includes an area capable of storing a copy mode related to the block on a first page among a plurality of pages contained in the block.

In the foregoing case, since the first page of each block includes the copy mode storage area capable of storing a copy mode related to the block, it is possible to determine the copy method of the other pages merely by reading the copy mode of the block from the copy mode storage area of the first page, and thereby shorten the processing time.

Preferably, upon receiving a write command from an access device that is configured communicably with the nonvolatile storage device, the access control unit copies data stored on the page associated with the first copy method to a page of the copy destination block area after the error correction by the error correction control unit, copies data stored on the page associated with the second copy method to a page of the copy destination block without performing the error correction by the error correction control unit for pages other than the page to which write data is to be written according to a copy mode stored in the copy mode storage, and changes the copy mode associated with the copy destination block to a copy mode subsequent to the copy mode of the copy source block.

In the foregoing case, upon receiving a write command from an access device, since the copy processing based on the first copy method or the copy processing based on the second copy method is executed according to the copy mode for pages other than the page to which write data is to be written, and the copy mode associated with the copy destination block is changed to the copy mode subsequent to the copy mode of the copy source block, it is possible to cause the processing time of data writing from the access device to be the same while maintaining the reliability of data upon deleting the data in block units and copying data of pages other than the page to which the write data is to be written in order to write data.

Industrial Applicability

Since the present invention is able to reduce the buffer capacity to be mounted on an access device and thereby reduce costs by equalizing the processing time of data writing from the access device while maintaining the reliability of data upon writing data in a nonvolatile storage device, it can be suitably applied to the writing of data of the nonvolatile storage device using a nonvolatile memory.

The invention claimed is:

1. A nonvolatile storage device, comprising:
a nonvolatile memory configured from a plurality of blocks which serve as erasing units, including a plurality of pages which serve as writing units; and
a memory controller which performs writing and reading of data to and from the nonvolatile memory,
wherein the nonvolatile memory includes a copy mode storage area capable of storing copy modes for deciding a method of copying data to the respective blocks, in association with the respective blocks,
wherein the memory controller includes:
an access control unit which controls a writing operation and a reading operation of data to and from the nonvolatile memory; and
an error correction control unit which performs error correction of data stored in the nonvolatile memory,
wherein the copy modes include N types (N is a natural number of 2 or higher) of copy modes from a first copy mode to an Nth copy mode,
wherein each of the first to Nth copy modes defines, for each page, either a first copy method which copies data after performing the error correction by the error correction control unit, or a second copy method which copies data without performing the error correction by the error correction control unit,
wherein each of the pages is associated with the first copy method in one or more copy modes among the first to Nth copy modes, and associated with the second copy method in other copy modes,
wherein each of the first to Nth copy modes includes a page which is associated with the first copy method and a page which is associated with the second copy method,
wherein a page subsequent to a page associated with the first copy method is associated with the second copy method in each of the first to Nth copy modes, and a page associated with the first copy method in the first copy mode is associated with the second copy method in a second copy mode subsequent to the first copy mode, and
wherein upon copying data stored on a page in a copy source block to a page in a copy destination block,
(i) the access control unit, according to a copy mode associated with the copy source block stored in the copy mode storage area (a) copies data stored on the page in the copy source block to the page in the copy destination block after performing the error correction by the error correction control unit when the page in the copy source block is associated with the first copy method, and (b) copies data stored on the page in the copy source block to the page in the copy destination block without performing the error correction by the error correction control unit when the page in the copy source block is associated with the second copy method, and
(ii) the access control unit changes a copy mode associated with the copy destination block to a copy mode that is different from the copy mode associated with the copy source block.

2. The nonvolatile storage device according to claim 1, wherein, as the copy mode storage area, each of the blocks includes an area capable of storing a copy mode related to the block on one or more pages among a plurality of pages contained in the block.

3. The nonvolatile storage device according to claim 1, wherein, upon performing copy processing according to the second copy method, the access control unit sends a command instructing the copy processing according to the second copy method to the nonvolatile memory, and thereby causes the copy processing according to the second copy method to be executed in the nonvolatile memory.

4. The nonvolatile storage device according to claim 1, wherein each of the pages is associated with the first copy method only in one copy mode among the first to Nth copy modes.

5. The nonvolatile storage device according to claim 1, wherein each of the pages is associated with the first copy method equally in the first to Nth copy modes.

6. The nonvolatile storage device according to claim 1, wherein each of the pages is associated with the first copy method in the first to Nth copy modes so that a copy count by the first copy method becomes the same.

7. The nonvolatile storage device according to claim 1, wherein, as the copy mode storage area, each of the blocks includes an area capable of storing a copy mode related to the block on a first page among a plurality of pages contained in the block.

8. The nonvolatile storage device according to claim 1, wherein, upon receiving a write command from an access device that is configured communicably with the nonvolatile storage device,
(i) the access control unit, according to a copy mode associated with a copy source block stored in the copy mode storage area, (a) copies data stored on a page in the copy source block to a page in a copy destination block after performing the error correction by the error correction control unit, and (b) copies data stored on the page in the copy source block to the page in the copy destination block without performing the error correction by the error correction control unit for pages other than the page to which write data is to be written, and
(ii) the access control unit changes a copy mode associated with the copy destination block to a copy mode subsequent to the copy mode associated with the copy source block.

9. A memory controller which performs writing and reading of data to and from a nonvolatile memory configured from a plurality of blocks which serve as erasing units, including a plurality of pages which serve as writing units,
wherein the nonvolatile memory includes a copy mode storage area capable of storing copy modes for deciding a method of copying data to the respective blocks, in association with the respective blocks,
the memory controller comprising:
an access control unit which controls a writing operation and a reading operation of data to and from the nonvolatile memory; and
an error correction control unit which performs error correction of data stored in the nonvolatile memory,
wherein the copy modes include N types (N is a natural number of 2 or higher) of copy modes from a first copy mode to an Nth copy mode,
wherein each of the first to Nth copy modes defines, for each page, either a first copy method which copies data after performing the error correction by the error correction control unit, or a second copy method which copies data without performing the error correction by the error correction control unit, wherein each of the pages is associated with the first copy method in one or more copy modes among the first to Nth copy modes, and associated with the second copy method in other copy modes, wherein each of the first to Nth copy modes includes a page which is associated with the first copy method and a page which is associated with the second copy method, wherein a page subsequent to a page associated with the first copy method is associated with the second copy method in each of the first to Nth copy modes, and a page associated with the first copy method in the first copy mode is associated with the second copy method in a second copy mode subsequent to the first copy mode, and wherein upon copying data stored on a page in a copy source block to a page in a copy destination block, (i) the access control unit, according to a copy mode associated with the copy source block stored in the copy mode storage area, (a) copies data stored on the page in the copy source block to the page in the copy destination block after performing the error correction by the error correction control unit when the page in the copy source block is associated with the first copy method, and (b) copies data stored on the page in the copy source block to the page in the copy destination block without performing the error correction by the error correction control unit when the page in the copy source block is associated with the second copy mode, and (ii) the access control unit changes a copy mode associated with the copy destination block to a copy mode that is different from the copy mode associated with the copy source block.

* * * * *